(12) United States Patent
Nakamura et al.

(10) Patent No.: US 11,107,685 B2
(45) Date of Patent: Aug. 31, 2021

(54) SEMICONDUCTOR MANUFACTURING METHOD AND SEMICONDUCTOR MANUFACTURING DEVICE

(71) Applicant: MITSUBISHI ELECTRIC CORPORATION, Chiyoda-ku (JP)

(72) Inventors: Keisuke Nakamura, Chiyoda-ku (JP); Muneyoshi Suita, Chiyoda-ku (JP); Akifumi Imai, Chiyoda-ku (JP); Kenichiro Kurahashi, Chiyoda-ku (JP); Tomohiro Shinagawa, Chiyoda-ku (JP); Takashi Matsuda, Chiyoda-ku (JP); Koji Yoshitsugu, Chiyoda-ku (JP); Eiji Yagyu, Chiyoda-ku (JP); Kunihiko Nishimura, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/474,639

(22) PCT Filed: Feb. 1, 2018

(86) PCT No.: PCT/JP2018/003408
§ 371 (c)(1),
(2) Date: Jun. 28, 2019

(87) PCT Pub. No.: WO2018/143344
PCT Pub. Date: Aug. 9, 2018

(65) Prior Publication Data
US 2019/0362974 A1  Nov. 28, 2019

(30) Foreign Application Priority Data

Feb. 2, 2017 (JP) .............................. JP2017-017352

(51) Int. Cl.
*H01L 23/00* (2006.01)
*H01L 21/70* (2006.01)
(Continued)

(52) U.S. Cl.
CPC ...... *H01L 21/187* (2013.01); *H01L 21/02376* (2013.01); *H01L 21/447* (2013.01)

(58) Field of Classification Search
CPC ..... H01L 24/26; H01L 21/4882; H01L 23/36; H01L 24/83; H01L 2224/8385;
(Continued)

(56) References Cited

U.S. PATENT DOCUMENTS 5,071,785 A * 12/1991 Nakazato ............ H01L 21/2007
                                                              438/457
5,273,553 A * 12/1993 Hoshi ............... H01L 21/67092
                                                              29/25.01
(Continued)

FOREIGN PATENT DOCUMENTS

JP        5-217819 A      8/1993
JP        9-260539 A     10/1997
(Continued)

OTHER PUBLICATIONS

International Search Report dated May 1, 2018 in PCT/JP2018/003408 filed on Feb. 1, 2018.

*Primary Examiner* — Brian Turner
(74) *Attorney, Agent, or Firm* — Xsensus LLP

(57) ABSTRACT

The semiconductor manufacturing device includes: a lower substrate support base configured to support a diamond substrate; an upper substrate support base configured to support a semiconductor substrate; a support base drive unit configured to move the lower substrate support base and the upper substrate support base to bring the diamond substrate and the semiconductor substrate into close contact with each (Continued)

other under a state in which a pressure is applied to the diamond substrate and the semiconductor substrate in a thickness direction; and a second mechanism configured to deform a surface of the upper substrate support base opposed to the lower substrate support base so that a surface of the semiconductor substrate opposed to the diamond substrate forms a parallel surface or a parallel plane with respect to a surface of the diamond substrate opposed to the semiconductor substrate.

9 Claims, 11 Drawing Sheets

(51) Int. Cl.
*H01L 21/18* (2006.01)
*H01L 21/76* (2006.01)
*H01L 21/02* (2006.01)
*H01L 21/447* (2006.01)

(58) Field of Classification Search
CPC ......... H01L 2924/14; H01L 2924/014; H01L 2924/01013; H01L 2224/83894; H01L 2924/01079; H01L 2924/01033; H01L 2224/8319; H01L 2924/01029; H01L 2924/01006; H01L 2924/07802; H01L 2924/01005

See application file for complete search history.

(56) References Cited

U.S. PATENT DOCUMENTS

| | | | |
|---|---|---|---|
| 2012/0280352 A1* | 11/2012 | Hochstadter | H01L 23/3732 257/466 |
| 2014/0084450 A1* | 3/2014 | Nielson | H01L 24/97 257/734 |
| 2014/0370624 A1* | 12/2014 | Farooq | H01L 21/67248 438/5 |
| 2015/0076662 A1* | 3/2015 | Aida | H01L 21/187 257/615 |
| 2016/0101598 A1* | 4/2016 | Matsushita | B32B 9/04 428/336 |
| 2017/0053823 A1* | 2/2017 | Huang | H01L 21/6838 |
| 2017/0278803 A1* | 9/2017 | Sugaya | B23K 20/023 |
| 2019/0214260 A1* | 7/2019 | Francis | H01L 21/187 |

FOREIGN PATENT DOCUMENTS

| | | |
|---|---|---|
| JP | 2000-348992 A | 12/2000 |
| JP | 4654389 B2 | 3/2011 |

* cited by examiner

SEMICONDUCTOR MANUFACTURING METHOD AND SEMICONDUCTOR MANUFACTURING DEVICE

TECHNICAL FIELD

The present invention relates to a semiconductor manufacturing method and a semiconductor manufacturing device for bonding, for example, a semiconductor substrate and a diamond substrate to each other.

BACKGROUND ART

There has hitherto been known a surface-activated joining method involving activating a joint surface between a diamond substrate that is a first substrate and a semiconductor substrate that is a second substrate to chemically bind the diamond substrate and the semiconductor substrate to each other without interposing an adhesive layer therebetween. In the surface-activated joining method, the joint surface between the diamond substrate and the semiconductor substrate is flattened so as to have an arithmetic average surface roughness (Ra) of 30 nm or less. After that, under a state in which the diamond substrate and the semiconductor substrate are placed in a vacuum, a rare gas beam is applied to the joint surface between the diamond substrate and the semiconductor substrate to activate the joint surface between the diamond substrate and the semiconductor substrate, to thereby chemically bind the diamond substrate and the semiconductor substrate to each other (see, for example, Patent Literature 1).

CITATION LIST

Patent Literature

[PTL 1] JP 4654389 B2

SUMMARY OF INVENTION

Technical Problem

The diamond substrate has large warpage as compared to a silicon substrate. Therefore, in order to activate the joint surface between the diamond substrate and the semiconductor substrate to chemically bind the diamond substrate and the semiconductor substrate to each other, it is required that a pressure be applied to the diamond substrate and the semiconductor substrate in a thickness direction to bring the diamond substrate and the semiconductor substrate into close contact with each other. However, the diamond substrate is a brittle material, and hence the diamond substrate cannot withstand deformation caused by an applied pressure, with the result that there is a risk in that breakage may occur in the diamond substrate.

The present invention has been made in order to solve the above-mentioned problem, and an object of the present invention is to provide a semiconductor manufacturing method and a semiconductor manufacturing device, which are capable of reducing occurrence of breakage in a diamond substrate when the diamond substrate and a semiconductor substrate are chemically bound to each other.

Solution to Problem

According to one embodiment of the present invention, there is provided a semiconductor manufacturing method including: a first substrate arranging step of arranging a diamond substrate on a first substrate support base; a second substrate arranging step of arranging a semiconductor substrate on a second substrate support base provided so as to be opposed to the first substrate support base; a support base moving step of, after the first substrate arranging step and the second substrate arranging step, moving one or both of the first substrate support base and the second substrate support base to bring the diamond substrate and the semiconductor substrate into close contact with each other under a state in which a pressure is applied to the diamond substrate and the semiconductor substrate in a thickness direction of the semiconductor substrate; a first substrate support base deforming step of deforming a surface of the first substrate support base opposed to the second substrate support base in conformity with a shape of a surface of the diamond substrate opposed to the first substrate support base; and a second substrate support base deforming step of, after the first substrate support base deforming step, deforming a surface of the second substrate support base opposed to the first substrate support base so that a surface of the semiconductor substrate opposed to the diamond substrate forms a parallel surface or a parallel plane with respect to a surface of the diamond substrate opposed to the semiconductor substrate.

Advantageous Effects of Invention

According to the semiconductor manufacturing method of one embodiment of the present invention, the diamond substrate and the semiconductor substrate can be brought into close contact with each other by applying a large pressure to the diamond substrate and the semiconductor substrate without deforming the diamond substrate. Therefore, the occurrence of breakage in the diamond substrate can be reduced when the diamond substrate and the semiconductor substrate are chemically bound to each other.

DESCRIPTION OF EMBODIMENTS

Figure 1:
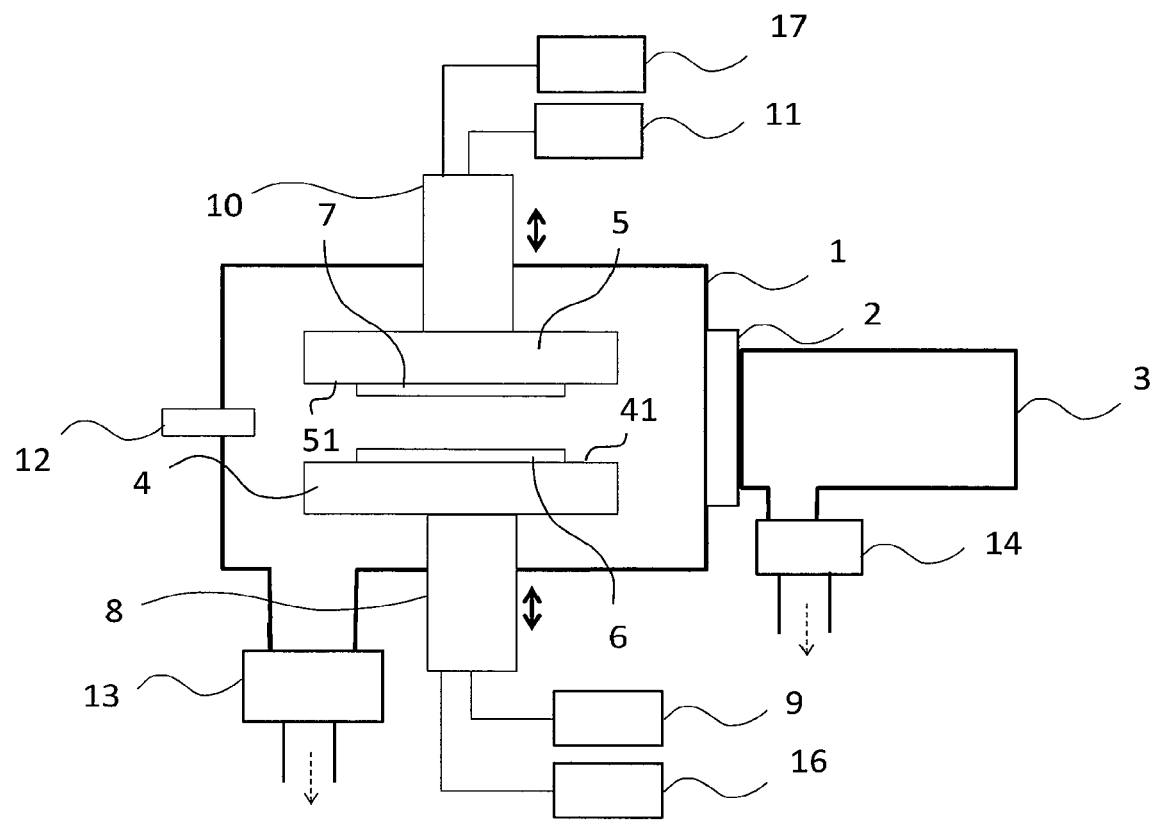
FIG. 1 is a schematic view for illustrating a semiconductor manufacturing device according to a first embodiment of the present invention.

Now, a semiconductor manufacturing device according to each of embodiments of the present invention is described in detail with reference to the drawings. In the drawings, like reference symbols denote like or corresponding portions. The present invention is not limited to each of the embodiments. In addition, views for illustrating a semiconductor manufacturing device used in each of the embodiments are schematic views, and hence each dimensional relationship and ratio in a length direction, a depth direction, and a height direction are different from actual ones.

First Embodiment

As a semiconductor electronic element to be operated in a high-output region, there has been used a field-effect transistor formed of a wide bandgap semiconductor, for example, gallium nitride (GaN). When the output of the semiconductor electronic element is high, the temperature of the semiconductor electronic element increases, and the characteristics and reliability of the semiconductor electronic element decrease. In order to suppress an increase in temperature of the semiconductor electronic element, it is important to set a material or structure having a high heat radiation property in the vicinity of a heat generating portion of the semiconductor electronic element. As a specific example of suppressing an increase in temperature of the semiconductor electronic element, it has been proposed to set a heat radiating material on a gallium nitride substrate.

As the heat radiating material, diamond is used. Diamond has high thermal conductivity and hence is an optimum substance as the heat radiating material. When a diamond substrate and a semiconductor substrate forming a nitride semiconductor element are bonded or joined to each other, the heat radiation property from the nitride semiconductor element is improved. The diamond substrate is manufactured by chemical vapor deposition (CVD). The diamond substrate is used in, for example, a heat sink or an optical window for a high-intensity laser.

As a method of attaching the diamond substrate and the semiconductor substrate, for example, a gallium nitride substrate to each other, there is given a method of bonding the diamond substrate and the semiconductor substrate to each other by inserting a thermally conductive grease or a thermally conductive silicon rubber therebetween as an adhesive layer or through use of a thermally conductive adhesive or solder. However, in those methods, an adhesive layer of a grease, a silicon rubber, an adhesive, or solder is interposed between the diamond substrate and the semiconductor substrate, and the adhesive layer has thermal conductivity that is significantly inferior to that of diamond. As a result, the thermal resistance between the diamond substrate and the semiconductor substrate increases, and the heat radiation efficiency of the semiconductor substrate using the diamond substrate decreases.

In order to enable the excellent thermal conductivity of diamond to be exhibited, there has been proposed a surface-activated joining method involving activating a joint surface between the diamond substrate and the semiconductor substrate to chemically bind the diamond substrate and the semiconductor substrate to each other without interposing the adhesive layer therebetween. A semiconductor manufacturing device and a semiconductor manufacturing method according to a first embodiment of the present invention use the surface-activated joining method.

FIG. 1 is a schematic view for illustrating the semiconductor manufacturing device according to the first embodiment of the present invention. The semiconductor manufacturing device includes a container 1, a gate valve 2 provided on the container 1, and a load lock chamber 3 connected to the container 1 through the gate valve 2.

In addition, the semiconductor manufacturing device includes a lower substrate support base 4, which is a first substrate support base, and an upper substrate support base 5, which is a second substrate support base, and is provided so as to be opposed to the lower substrate support base 4. The lower substrate support base 4 is configured to support a diamond substrate 6, which is a first substrate. The upper substrate support base 5 is configured to support a semiconductor substrate 7, which is a second substrate.

The lower substrate support base 4 can move in a direction of approaching and leaving the upper substrate support base 5. In addition, in the lower substrate support base 4, the shape of a surface 41 of the lower substrate support base 4, which is a surface opposed to the diamond substrate 6, can be deformed. The lower substrate support base 4 is arranged in the container 1.

The upper substrate support base 5 can move in a direction of approaching and leaving the lower substrate support base 4. In addition, in the upper substrate support base 5, the shape of a surface 51 of the upper substrate support base 5, which is a surface opposed to the semiconductor substrate 7, can be deformed. The upper substrate support base 5 is arranged in the container 1.

In addition, the semiconductor manufacturing device includes a lower substrate support base drive unit 8, a lower substrate support base drive control unit 9, an upper substrate support base drive unit 10, and an upper substrate support base drive control unit 11. The lower substrate support base drive unit 8 is configured to move the lower substrate support base 4. The lower substrate support base drive control unit 9 is configured to control drive of the lower substrate support base drive unit 8. The upper substrate support base drive unit 10 is configured to move the upper substrate support base 5. The upper substrate support base drive control unit 11 is configured to control drive of the upper substrate support base drive unit 10. The lower substrate support base drive unit 8 and the upper substrate support base drive unit 10 form a support base drive unit.

In addition, the semiconductor manufacturing device includes a beam source 12, a vacuum pump 13, and a vacuum pump 14. The beam source 12 is provided to the container 1, and is configured to emit a rare gas beam. The vacuum pump 13 is configured to vacuumize the inside of the container 1. The vacuum pump 14 is configured to vacuumize the inside of the load lock chamber 3.

Figure 2:
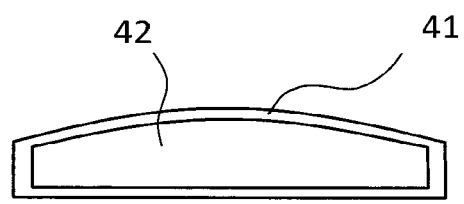
FIG. 2 is an enlarged view for illustrating an inside of a lower substrate support base of FIG. 1.

FIG. 2 is an enlarged view for illustrating the inside of the lower substrate support base 4 of FIG. 1. The surface 41 of the lower substrate support base 4, which is brought into contact with the diamond substrate 6, is made of a deformable material such as resin, thin plate metal, or a laminate of metal and resin. In addition, a cavity 42 is formed in the lower substrate support base 4. Through introduction of high-pressure gas or high-pressure liquid into the cavity 42, the surface 41 can be deformed into any shape. A mechanism configured to introduce high-pressure gas or high-pressure liquid into the cavity 42 forms a first mechanism. The first mechanism is configured to deform the surface 41 of the lower substrate support base 4, which is a surface opposed to the upper substrate support base 5, in conformity with the shape of a surface of the diamond substrate 6 opposed to the lower substrate support base 4. As gas to be introduced into the cavity 42, there is given, for example, air. As liquid to be introduced into the cavity 42, there is given, for example, oil.

Although not shown, a cavity is formed also in the upper substrate support base 5. Through introduction of high-pressure gas or high-pressure liquid into the cavity, a surface 51 of the upper substrate support base 5 can be deformed into any shape. A mechanism configured to introduce high-pressure gas or high-pressure liquid into the cavity of the upper substrate support base 5 forms a second mechanism. The second mechanism is configured to deform the surface 51 of the upper substrate support base 5, which is a surface opposed to the lower substrate support base 4, so that a surface of the semiconductor substrate 7 opposed to the diamond substrate 6 forms a parallel surface or a parallel plane with respect to a surface of the diamond substrate 6 opposed to the semiconductor substrate 7. As gas to be introduced into the cavity of the upper substrate support base 5, there is given, for example, air. As liquid to be introduced into the cavity, there is given, for example, oil.

Figure 3:
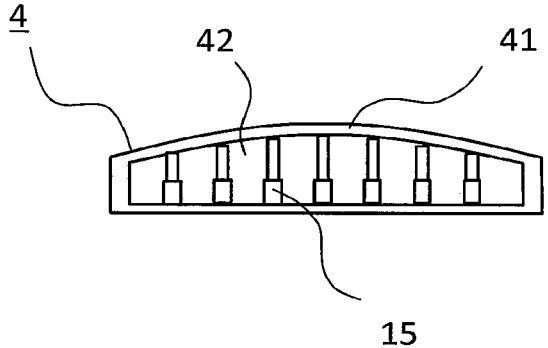
FIG. 3 is an enlarged view for illustrating a modification example of the inside of the lower substrate support base of FIG. 1.

FIG. 3 is an enlarged view for illustrating a modification example of the inside of the lower substrate support base 4. The semiconductor manufacturing device may include one or a plurality of lower actuators 15 configured to change the shape of the surface 41 of the lower substrate support base 4. When the lower actuators 15 are driven, the surface 41 is deformed. In this case, the lower actuators form the first mechanism. Further, although not shown, the semiconductor manufacturing device may include one or a plurality of upper actuators configured to change the shape of the surface 51 of the upper substrate support base 5. In this case, the upper actuators form the second mechanism.

As illustrated in FIG. 1, the semiconductor manufacturing device includes a lower substrate support base surface shape control unit 16 and an upper substrate support base surface shape control unit 17. The lower substrate support base surface shape control unit 16 is configured to control drive of the first mechanism. The upper substrate support base surface shape control unit 17 is configured to control drive of the second mechanism.

The lower substrate support base 4 contains an electrode (not shown). When a voltage is applied to the electrode contained in the lower substrate support base 4, charge is induced into a contact surface between the diamond substrate 6 and the lower substrate support base 4, and the diamond substrate 6 is fixed to the lower substrate support base 4 with a generated electrostatic force.

The upper substrate support base 5 contains an electrode (not shown) as in the lower substrate support base 4. When a voltage is applied to the electrode contained in the upper substrate support base 5, charge is induced into a contact surface between the semiconductor substrate 7 and the upper substrate support base 5, and the semiconductor substrate 7 is fixed to the upper substrate support base 5 with a generated electrostatic force.

When the lower substrate support base 4 is moved by the lower substrate support base drive unit 8, and the upper substrate support base 5 is moved by the upper substrate support base drive unit 10, the diamond substrate 6 fixed to the lower substrate support base 4 and the semiconductor substrate 7 fixed to the upper substrate support base 5 are brought into close contact with each other under a state in which a pressure is applied to the diamond substrate 6 and the semiconductor substrate 7 in a thickness direction of the semiconductor substrate 7. The magnitude of the pressure applied to the diamond substrate 6 and the semiconductor substrate 7 is controlled by the lower substrate support base drive control unit 9 and the upper substrate support base drive control unit 11.

In this example, description is given of the configuration in which the semiconductor manufacturing device includes both the lower substrate support base drive unit 8 and the upper substrate support base drive unit 10. However, the semiconductor manufacturing device may include only one of the lower substrate support base drive unit 8 and the upper substrate support base drive unit 10. That is, the semiconductor manufacturing device may be able to move only one of the diamond substrate 6 and the semiconductor substrate 7 in a direction of approaching and leaving another.

Figure 4:
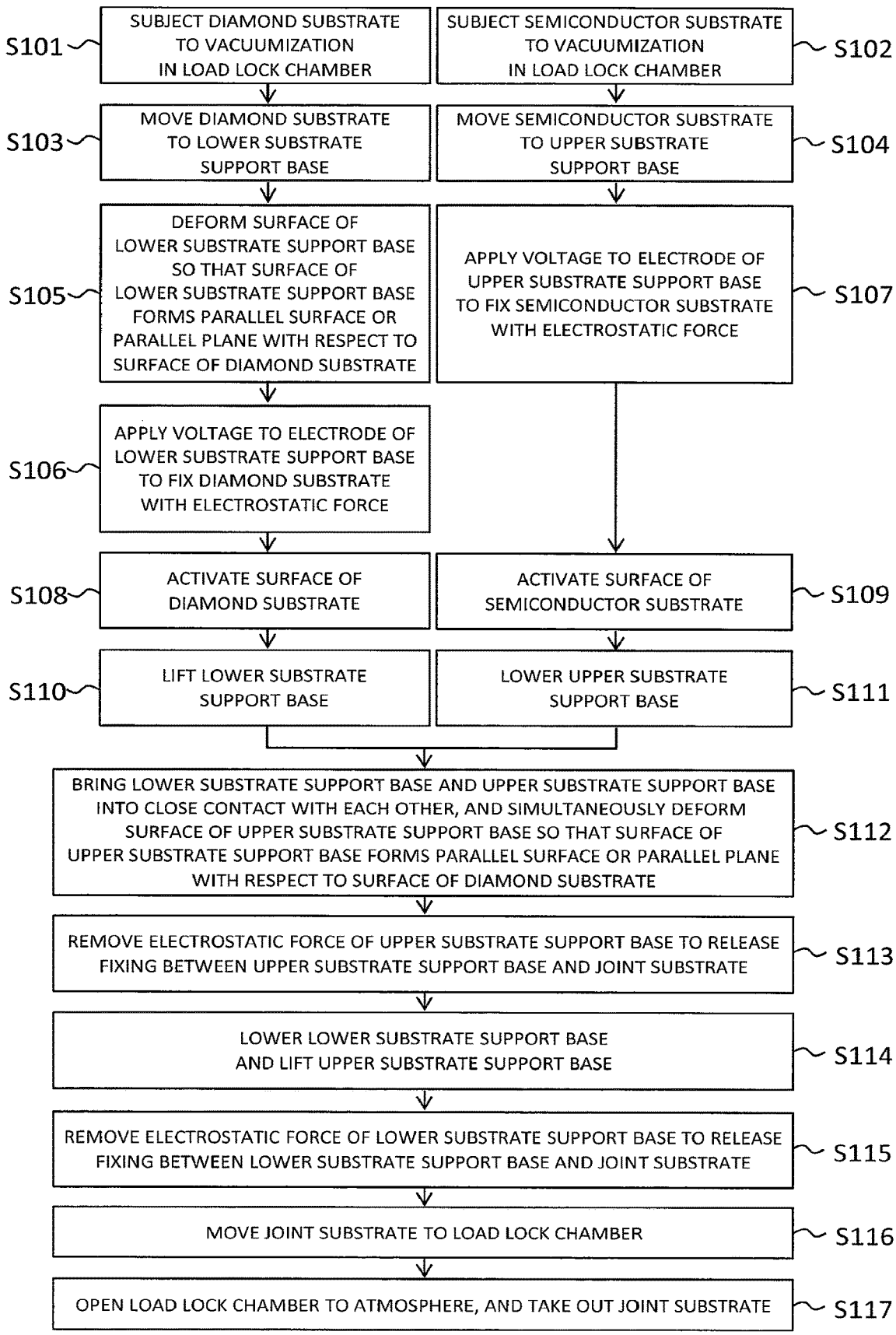
FIG. 4 is a flowchart for illustrating a semiconductor manufacturing method for chemically joining a diamond substrate and a semiconductor substrate to each other through use of the semiconductor manufacturing device of FIG. 1.

Next, description is given of a semiconductor manufacturing method for chemically binding the diamond substrate 6 and the semiconductor substrate 7 through use of a semiconductor manufacturing device. FIG. 4 is a flowchart for illustrating the semiconductor manufacturing method for chemically joining the diamond substrate 6 and the semiconductor substrate 7 to each other through use of the semiconductor manufacturing device of FIG. 1. First, the diamond substrate 6 and the semiconductor substrate 7 are placed in the load lock chamber 3. After that, in Step S101, the vacuum pump 13 is driven to vacuumize the inside of the container 1, and in Step S102, the vacuum pump 14 is driven to vacuumize the inside of the load lock chamber 3.

After that, the gate valve 2 is opened to move the diamond substrate 6 and the semiconductor substrate 7 from the load lock chamber 3 to the container 1. In Step S103, the diamond substrate 6 is moved to the surface 41 of the lower substrate support base 4, and in Step S104, the semiconductor substrate 7 is moved to the surface 51 of the upper substrate support base 5. The process in Step S103 forms a first substrate arranging step. The process in Step S104 forms a second substrate arranging step. After the diamond substrate 6 and the semiconductor substrate 7 are moved from the load lock chamber 3 to the container 1, the gate valve 2 is closed.

After that, in Step S105, the surface 41 of the lower substrate support base 4 is deformed so as to form a parallel surface or a parallel plane with respect to the surface of the diamond substrate 6 opposed to the lower substrate support base 4. In other words, the surface 41 of the lower substrate support base 4, which is a surface opposed to the upper substrate support base 5, is deformed in conformity with the shape of the surface of the diamond substrate 6 opposed to the lower substrate support base 4. The process in Step S105 forms a first substrate support base deforming step.

Figure 5:
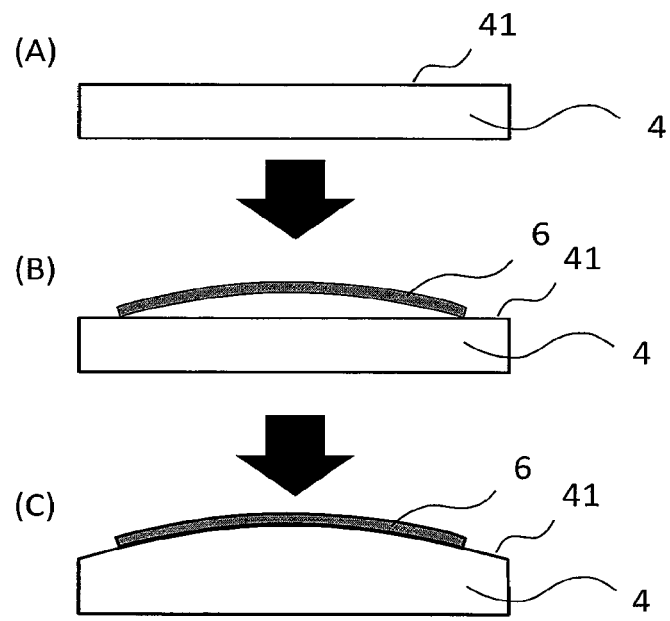
FIG. 5 is a view for illustrating a process in Step S105 of FIG. 4.

FIG. 5 is a view for illustrating the process in Step S105 of FIG. 4. In Step S105, as illustrated in (A), under a state in which nothing is arranged on the surface 41 of the lower substrate support base 4, the diamond substrate 6 is arranged on the surface 41 of the lower substrate support base 4 as illustrated in (B), and the surface 41 of the lower substrate support base 4 is deformed as illustrated in (C). After the diamond substrate 6 is arranged on the surface 41 of the lower substrate support base 4, the shape of the diamond substrate 6 with respect to the lower substrate support base 4, that is, a warped shape is measured through use of, for example, a laser displacement gauge in advance. The introduction of gas or liquid into the cavity 42 of the lower substrate support base 4, or the drive of the lower actuators 15 is controlled by the lower substrate support base surface shape control unit 16. In this example, description is given of a method involving arranging the diamond substrate 6 on the surface 41 of the lower substrate support base 4, and then deforming the surface 41 of the lower substrate support base 4. However, it may also be possible to adopt a method involving deforming the surface 41 of the lower substrate support base 4 in conformity with the shape of the surface of the diamond substrate 6 opposed to the lower substrate support base 4 in advance, and then arranging the diamond substrate 6 on the lower substrate support base 4.

As illustrated in FIG. 4, after a gap between the diamond substrate 6 and the lower substrate support base 4 becomes minimum in Step S105, in Step S106, the diamond substrate 6 is fixed to the lower substrate support base 4 with an electrostatic force generated by the application of a voltage to the electrode contained in the lower substrate support base 4.

After that, in Step S107, the semiconductor substrate 7 is fixed to the upper substrate support base 5 with an electrostatic force generated by the application of a voltage to the electrode contained in the upper substrate support base 5.

The semiconductor substrate 7, which is obtained by heteroepitaxially growing a single-crystal AlGaN and a single-crystal GaN on a Si substrate through intermediation of a buffer layer made of aluminum nitride (AlN) and aluminum gallium nitride (AlGaN), is arranged on the surface 51 of the upper substrate support base 5, and the semiconductor substrate 7 is fixed to the upper substrate support base 5 with an electrostatic force generated by the application of a voltage to the electrode contained in the upper substrate support base 5.

After that, in Step S108, under a state in which the diamond substrate 6 is fixed to the lower substrate support base 4, the diamond substrate 6 is irradiated with a neutral particle beam or a charged particle beam from the beam source 12 to remove impurities on the surface of the diamond substrate 6, to thereby expose chemically active dangling bonds to the surface of the diamond substrate 6. The process in Step S108 forms a first substrate surface activating step of activating the surface of the diamond substrate 6.

Further, simultaneously with Step S108, in Step S109, under a state in which the semiconductor substrate 7 is fixed to the upper substrate support base 5, the semiconductor substrate 7 is irradiated with a neutral particle beam or a charged particle beam from the beam source 12 to remove impurities on the surface of the semiconductor substrate 7, to thereby expose chemically active dangling bonds to the surface of the semiconductor substrate 7. The process in Step S109 constitutes a second substrate surface activating step of activating the surface of the semiconductor substrate 7.

As raw materials for the neutral particle beam and the charged particle beam, it is desired that inactive gas, for example, argon (Ar) having low reactivity with respect to the diamond substrate 6 and the semiconductor substrate 7 be used. In addition, the following may also be performed. The impurities on each of the surfaces of the diamond substrate 6 and the semiconductor substrate 7 are removed through use of ion bombardment or chemically active species in plasma caused by excitation of the plasma between the lower substrate support base 4 and the upper substrate support base 5, to thereby expose chemically active dangling bonds to the surface of the diamond substrate 6 and the surface of the semiconductor substrate 7.

After that, in Step S110, the lower substrate support base 4 is moved in a direction of approaching the upper substrate support base 5. In other words, in Step S110, the lower substrate support base 4 is lifted.

After that, simultaneously with Step S110, in Step S111, the upper substrate support base 5 is moved in a direction of approaching the lower substrate support base 4. In other words, in Step S111, the upper substrate support base 5 is lowered.

After that, in Step S112, the lower substrate support base 4 and the upper substrate support base 5 are brought into close contact with each other to bring the diamond substrate 6 and the semiconductor substrate 7 into close contact with each other, and simultaneously, the surface 51 of the upper substrate support base 5 is deformed so as to form a parallel surface or a parallel plane with respect to the surface of the diamond substrate 6. Step S112 includes a second substrate support base deforming step.

Figure 6:
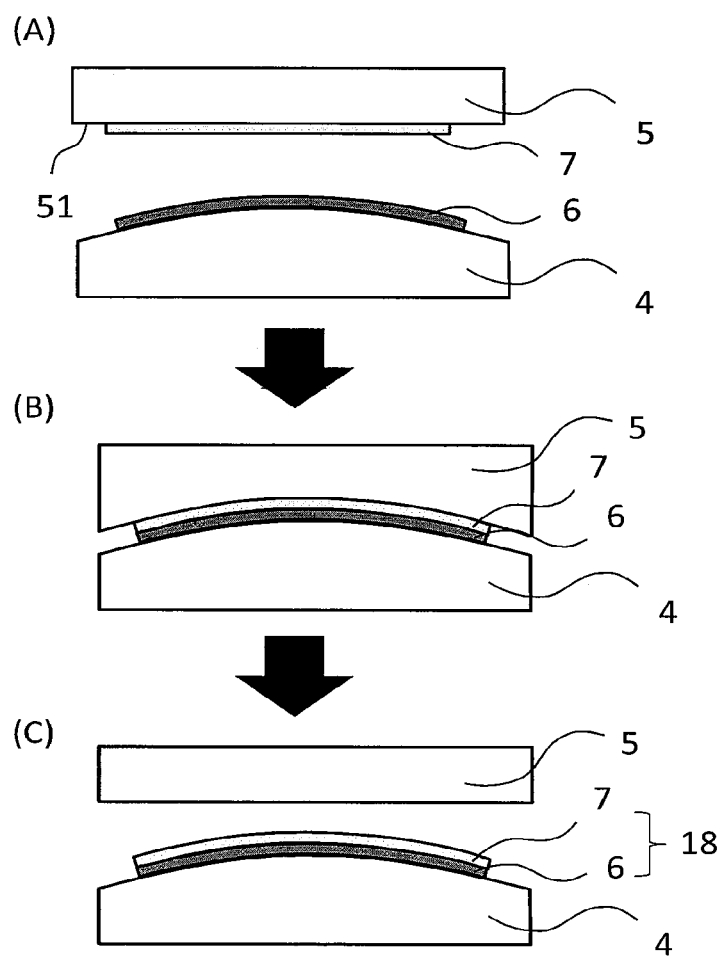
FIG. 6 is a view for illustrating a process in Step S110 to Step S114 of FIG. 4.

FIG. 6 is a view for illustrating a process in Step S110 to Step S114 of FIG. 4. In Step S112, as illustrated in (A), under a state in which the diamond substrate 6 and the semiconductor substrate 7 are separated from each other, as illustrated in (B), the surface 51 of the upper substrate support base 5, which a surface opposed to the lower substrate support base 4, is deformed so that the surface of the semiconductor substrate 7 opposed to the diamond substrate 6 forms a parallel surface or a parallel plane with respect to the surface of the diamond substrate 6 opposed to the semiconductor substrate 7.

In addition, in Step S112, both the lower substrate support base 4 and the upper substrate support base 5 are moved to bring the diamond substrate 6 and the semiconductor substrate 7 close to each other, and further, the diamond substrate 6 and the semiconductor substrate 7 are brought into close contact with each other under a state in which a pressure is applied to the diamond substrate 6 and the semiconductor substrate 7 in the thickness direction. Step S112 includes a support base moving step. With this, the diamond substrate 6 and the semiconductor substrate 7 are brought into close contact with each other. The pressure applied to the surface of the diamond substrate 6 and the surface of the semiconductor substrate 7 is adjusted within a range of from 10 kPa to 100 MPa. In this case, the surface 51 of the upper substrate support base 5 can be deformed into any shape in the same manner as in the lower substrate support base 4. Therefore, the surface of the semiconductor substrate 7 is brought into close contact with the diamond substrate 6 under a state of being deformed so as to form a parallel surface or a parallel plane with respect to the surface of the diamond substrate 6. As a result, dangling bonds on each of the surfaces of the diamond substrate 6 and the semiconductor substrate 7 are chemically bound to each other. With this, as illustrated in (C), a joint substrate 18, in which the diamond substrate 6 and the semiconductor substrate 7 are integrated, is formed.

The surface of the diamond substrate 6 opposed to the lower substrate support base 4 is brought into contact with the entire surface of the lower substrate support base 4 opposed to the diamond substrate 6, and the surface of the semiconductor substrate 7 opposed to the upper substrate support base 5 is brought into contact with the entire surface of the upper substrate support base 5 opposed to the semiconductor substrate 7. Therefore, a large adhesion force is uniformly applied to the joint surface between the diamond substrate 6 and the lower substrate support base 4 in a width direction. With this, a satisfactory joining property is obtained.

The following configuration may be adopted. A heating mechanism is contained each in the lower substrate support base 4 and the upper substrate support base 5, and in Step S112, the diamond substrate 6 and the semiconductor substrate 7 are brought into close contact with each other under a state in which the temperature is raised within a range of from 100° C. to 500° C. to improve adhesiveness between the diamond substrate 6 and the semiconductor substrate 7.

In order to obtain a satisfactory joining property, it is desired that each of the surfaces of the diamond substrate 6 and the semiconductor substrate 7 be subjected to flattening treatment in advance so that an arithmetic average roughness (Ra) of each surface reaches 30 nm or less. In addition, a thin film of, for example, amorphous silicon or silicon oxide may be formed in advance as an adhesive layer on both or any one of the diamond substrate 6 and the semiconductor substrate 7.

Figure 7:
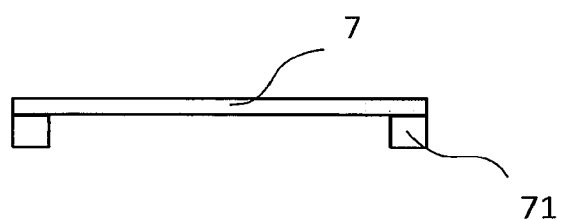
FIG. 7 is a view for illustrating a modification example of a semiconductor substrate of FIG. 1.

In order to prevent the semiconductor substrate 7 from being damaged when the semiconductor substrate 7 is deformed into a shape that is substantially parallel to the diamond substrate 6, it is desired that the semiconductor substrate 7 be thinned in advance so that a dimension of the semiconductor substrate 7 in the thickness direction reaches 20 μm or less. In order to thin the semiconductor substrate 7, the following may be performed. As illustrated in FIG. 7, Si and the buffer layer in a center portion of the semiconductor substrate 7 are removed to leave only the AlGaN/GaN epitaxial layer. In a region within 5 mm of an outer edge 71 of the semiconductor substrate 7, the Si substrate is left to ensure mechanical strength, to thereby facilitate handling of the semiconductor substrate 7. In this case, it is required that the outer diameter of the diamond substrate 6 to be joined be set to be smaller than the inner diameter of the semiconductor substrate 7 having the Si portion removed therefrom. The configuration illustrated in FIG. 7 is merely one example, and the semiconductor substrate 7 may be thinned to such a degree that a part of Si and the buffer layer in the center portion of the semiconductor substrate 7 remains.

As illustrated in FIG. 4, after the diamond substrate 6 and the semiconductor substrate 7 are joined to each other, in Step S113, the voltage applied to the electrode of the upper substrate support base 5 is canceled to remove the electrostatic force, to thereby release the fixing of the semiconductor substrate 7 to the upper substrate support base 5. With this, the fixing of the joint substrate 18 to the upper substrate support base 5 is released.

After that, in Step S114, the lower substrate support base 4 is lowered, and the upper substrate support base 5 is lifted. In Step S114, the lower substrate support base 4 and the upper substrate support base 5 are moved so that the lower substrate support base 4 and the upper substrate support base 5 are separated from each other. With this, the joint substrate 18 is separated from the upper substrate support base 5 and mounted on the lower substrate support base 4.

After that, in Step S115, the voltage applied to the electrode of the lower substrate support base 4 is canceled to remove the electrostatic force, to thereby release the fixing of the diamond substrate 6 to the lower substrate support base 4. With this, the fixing of the joint substrate 18 to the lower substrate support base 4 is released.

After that, in Step S116, the gate valve is opened, and the joint substrate 18 is moved from the container 1 to the load lock chamber 3. Then, in Step S117, the load lock chamber 3 is opened to the atmosphere, and the joint substrate 18 is taken out from the load lock chamber 3. Accordingly, the semiconductor manufacturing method for chemically binding the diamond substrate 6 and the semiconductor substrate 7 to each other through use of the semiconductor manufacturing device is completed.

As described above, in the semiconductor manufacturing device according to the first embodiment of the present invention, the diamond substrate 6 and the semiconductor substrate 7 can be brought into close contact with each other by applying a large pressure to the diamond substrate 6 and the semiconductor substrate 7 without deforming the diamond substrate 6. Therefore, the occurrence of breakage in the diamond substrate 6 can be reduced when the diamond substrate 6 and the semiconductor substrate 7 are chemically bound to each other.

In addition, the deformation of the diamond substrate 6 can be minimized. Therefore, even when a large adhesion force is applied, the occurrence of damage to the diamond substrate 6 is suppressed.

Further, in the semiconductor manufacturing method according to the first embodiment of the present invention, the diamond substrate 6 and the semiconductor substrate 7 can be brought into close contact with each other by applying a large pressure to the diamond substrate 6 and the semiconductor substrate 7 without deforming the diamond substrate 6. Therefore, the occurrence of breakage in the diamond substrate 6 can be reduced when the diamond substrate 6 and the semiconductor substrate 7 are chemically bound to each other.

In the first embodiment, description is given of the configuration in which the diamond substrate 6 is mounted on the lower substrate support base 4, and the semiconductor substrate 7 is fixed to the upper substrate support base 5. However, the vertically structured relationship between the diamond substrate 6 and the semiconductor substrate 7 may be reversed.

Figure 8:
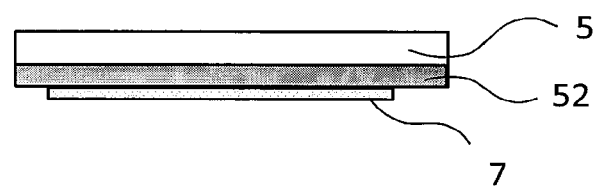
FIG. 8 is a view for illustrating a modification example of an upper substrate support base of FIG. 1.
Figure 9:
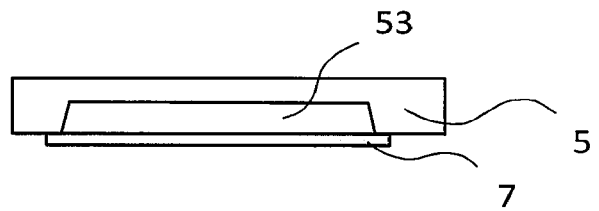
FIG. 9 is a view for illustrating a modification example of the upper substrate support base of FIG. 1.
Figure 10:
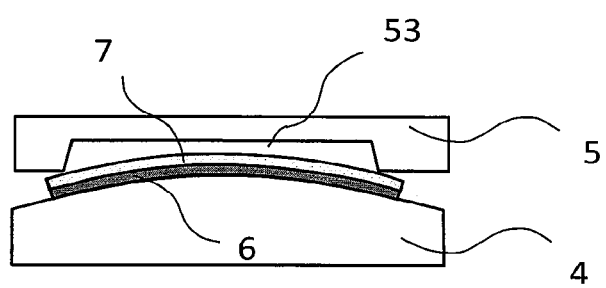
FIG. 10 is a view for illustrating a state in which the semiconductor substrate is deformed through use of the upper substrate support base of FIG. 9.

In addition, in the first embodiment, description is given of the structure in which the upper substrate support base 5, to which the semiconductor substrate 7 is fixed, can be deformed into any shape. However, for example, as illustrated in FIG. 8, the upper substrate support base 5 may have a soft layer 52 made of, for example, a silicon rubber in its surface layer portion. In this case, when the diamond substrate 6 and the semiconductor substrate 7 are brought into close contact with each other, the semiconductor substrate 7 is deformed so that, through deformation of the soft layer 52, the surface of the semiconductor substrate 7 opposed to the diamond substrate 6 forms a parallel surface or a parallel plane with respect to the surface of the diamond substrate 6 opposed to the semiconductor substrate 7. In addition, as illustrated in FIG. 9, a hollow portion 53 may be formed in a center portion of the upper substrate support base 5. In this case, as illustrated in FIG. 10, the semiconductor substrate 7 can be deformed in conformity with the warped shape of the diamond substrate 6 mounted on the lower substrate support base 4. In this case, it is desired that gas be introduced into the hollow portion 53 to provide the structure in which a pressure can be applied to the diamond substrate 6 and the semiconductor substrate 7 so that a strong adhesion force can be applied to the diamond substrate 6 and the semiconductor substrate 7.

In other words, the following configuration may be adopted. The upper substrate support base 5 is configured to support the semiconductor substrate 7 so that the surface of the semiconductor substrate 7 opposed to the diamond substrate 6 can be deformed, and when a pressure is applied to the diamond substrate 6 and the semiconductor substrate 7 in the thickness direction, the surface of the semiconductor substrate 7 opposed to the diamond substrate 6 forms a parallel surface or a parallel plane with respect to the surface of the diamond substrate 6 opposed to the semiconductor substrate 7 through use of the pressure. In this case, the semiconductor manufacturing device is not required to include the second mechanism.

In the first embodiment, the diamond substrate 6 given as an example may be made of any of single-crystal diamond or polycrystalline diamond, and may be a diamond substrate heteroepitaxilly grown on a silicon substrate or a metal substrate.

In addition, the semiconductor substrate 7 is not limited to a GaN-based material, and may be another semiconductor substrate. For example, a semiconductor can be manufactured as follows. The diamond substrate 6 and the silicon substrate that is a second substrate are joined to each other. After that, a GaN-based material is epitaxially grown on the surface of the silicon substrate. Thus, a semiconductor formed of the GaN-based epitaxial layer, the silicon substrate, and the diamond substrate 6 can be manufactured.

In addition, in the first embodiment, description is given of the method of joining substrates to each other, which involves irradiating the diamond substrate 6 and the semiconductor substrate 7 with a neutral particle beam or a charged particle beam to expose chemically active dangling bonds to each of the surfaces of the diamond substrate 6 and the semiconductor substrate 7 and binding the dangling bonds to each other. In addition, in the first embodiment, description is given of the method of joining substrates to each other, which involves exposing chemically active dangling bonds to each of the surfaces of the diamond substrate 6 and the semiconductor substrate 7 through use of ion bombardment or chemically active species in plasma caused by excitation of the plasma, and binding the dangling bonds to each other. The present invention is not limited thereto, and it may also be possible to adopt, for example, a method involving modifying each of the surfaces of the diamond substrate 6 and the semiconductor substrate 7 with a hydroxyl group by oxygen plasma treatment and hydrofluoric acid solution treatment, bringing the diamond substrate 6 and the semiconductor substrate 7 into close contact with each other, and joining the diamond substrate 6 and the semiconductor substrate 7 to each other through a hydrogen bond. When the oxygen plasma treatment and the hydrofluoric acid solution treatment are used, the process thereof is performed before Step S101, and the diamond substrate 6 and the semiconductor substrate 7, which have been subjected to the surface treatment, may be joined to each other through use of the semiconductor manufacturing device.

In addition, in the first embodiment, description is given of the configuration in which the diamond substrate 6 is arranged so as to be convex upwardly. However, the diamond substrate 6 may be arranged so as to be convex downwardly.

Second Embodiment

Figure 11:
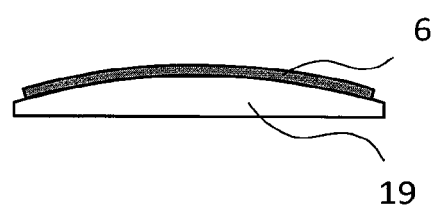
FIG. 11 is a view for illustrating a diamond substrate in a semiconductor manufacturing device according to a second embodiment of the present invention.

FIG. 11 is a view for illustrating a diamond substrate in a semiconductor manufacturing device according to a second embodiment of the present invention. The semiconductor manufacturing device includes a diamond substrate fixing jig 19, to which the diamond substrate 6 is fixed. The diamond substrate fixing jig 19 forms a first substrate fixing jig.

The diamond substrate fixing jig 19 is made of a hard material, for example, glass. A surface of the diamond substrate fixing jig 19, which is brought into contact with the diamond substrate 6, forms a parallel surface or a parallel plane with respect to a surface of the diamond substrate 6 opposed to the diamond substrate fixing jig 19. A surface of the diamond substrate fixing jig 19, which is separated from the diamond substrate 6, forms a flat surface. In order to set the surface of the diamond substrate fixing jig 19, which is brought into contact with the diamond substrate 6, to a parallel surface or a parallel plane with respect to the surface of the diamond substrate 6 opposed to the diamond substrate fixing jig 19, a plurality of diamond substrate fixing jigs 19 having different shapes are prepared in advance, and from among those diamond substrate fixing jigs 19, a diamond substrate fixing jig 19 that forms a parallel surface or a parallel plane with respect to the surface of the diamond substrate 6 opposed to the diamond substrate fixing jig 19 is selected. A mechanism capable of deform the diamond substrate fixing jig 19 to have a parallel surface or a parallel plane with respect to the surface of the diamond substrate 6 opposed to the diamond substrate fixing jig 19 may be contained in the diamond substrate fixing jig 19.

Figure 12:
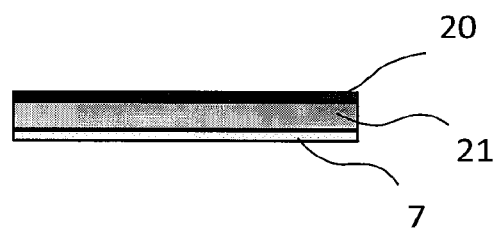
FIG. 12 is a view for illustrating a semiconductor substrate in the semiconductor manufacturing device according to the second embodiment of the present invention.

FIG. 12 is a view for illustrating a semiconductor substrate in the semiconductor manufacturing device according to the second embodiment of the present invention. The semiconductor manufacturing device includes a support substrate 20 and a soft adhesive layer 21. The support substrate 20 is provided on the upper substrate support base 5, and the semiconductor substrate 7 is fixed to the support substrate 20. The soft adhesive layer 21 is formed between the support substrate 20 and the semiconductor substrate 7. The upper substrate support base 5 is configured to support the semiconductor substrate 7 so that the surface of the semiconductor substrate 7 opposed to the diamond substrate 6 can be deformed, and when a pressure is applied to the diamond substrate 6 and the semiconductor substrate 7 in the thickness direction, the surface of the semiconductor substrate 7 opposed to the diamond substrate 6 forms a parallel surface or a parallel plane with respect to the surface of the diamond substrate 6 opposed to the semiconductor substrate 7 through use of the pressure. The other configurations are the same as those of the first embodiment.

Figure 13:
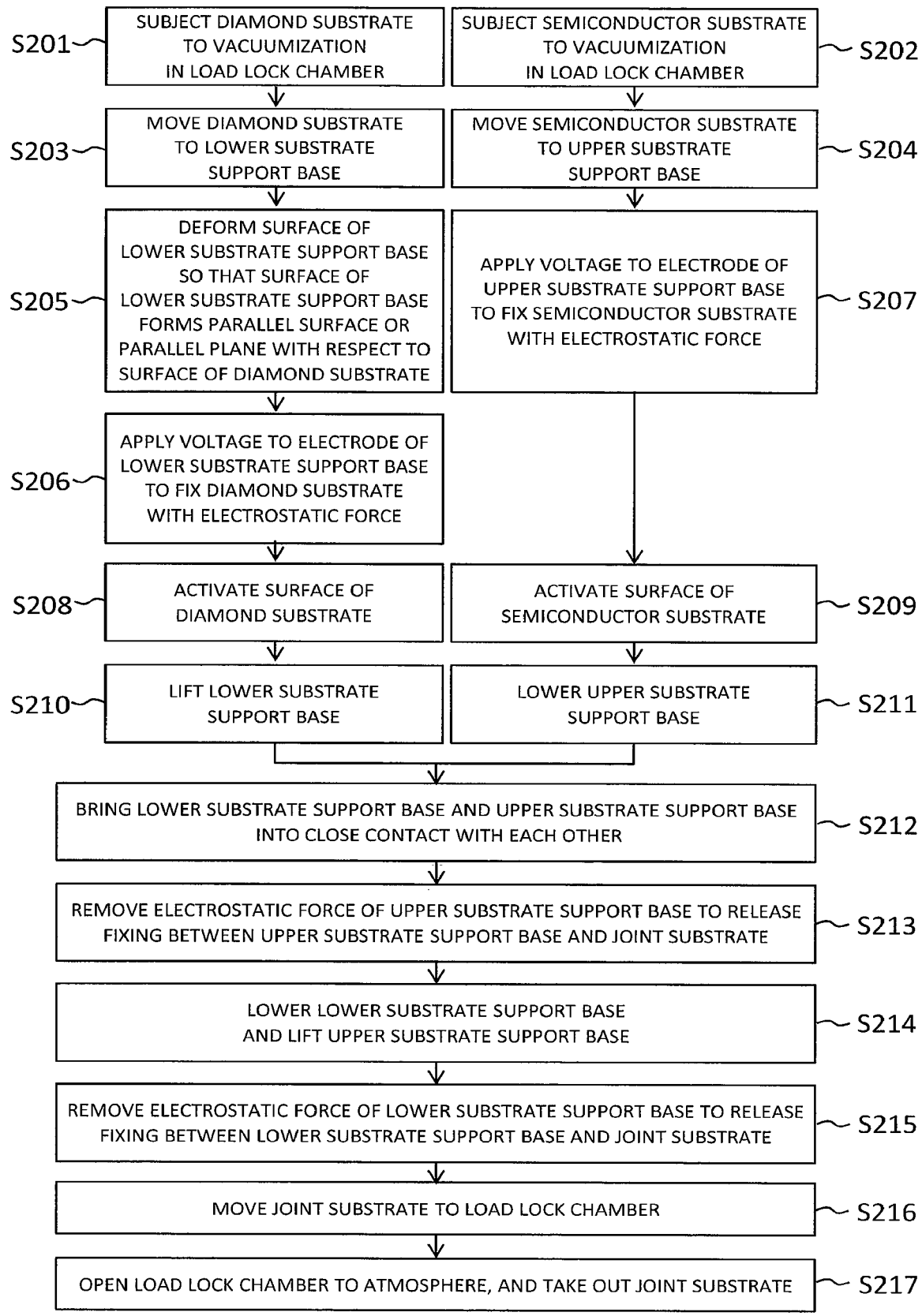
FIG. 13 is a flowchart for illustrating a semiconductor manufacturing method for chemically joining the diamond substrate and the semiconductor substrate to each other through use of the semiconductor manufacturing device according to the second embodiment of the present invention.

Next, description is given of a semiconductor manufacturing method for chemically binding the diamond substrate 6 and the semiconductor substrate 7 through use of a semiconductor manufacturing device. FIG. 13 is a flowchart for illustrating the semiconductor manufacturing method for chemically joining the diamond substrate 6 and the semiconductor substrate 7 to each other through use of the semiconductor manufacturing device according to the second embodiment of the present invention. Step S201 to Step S211 are the same as Step S101 to Step S111 in the first embodiment.

Figure 14:
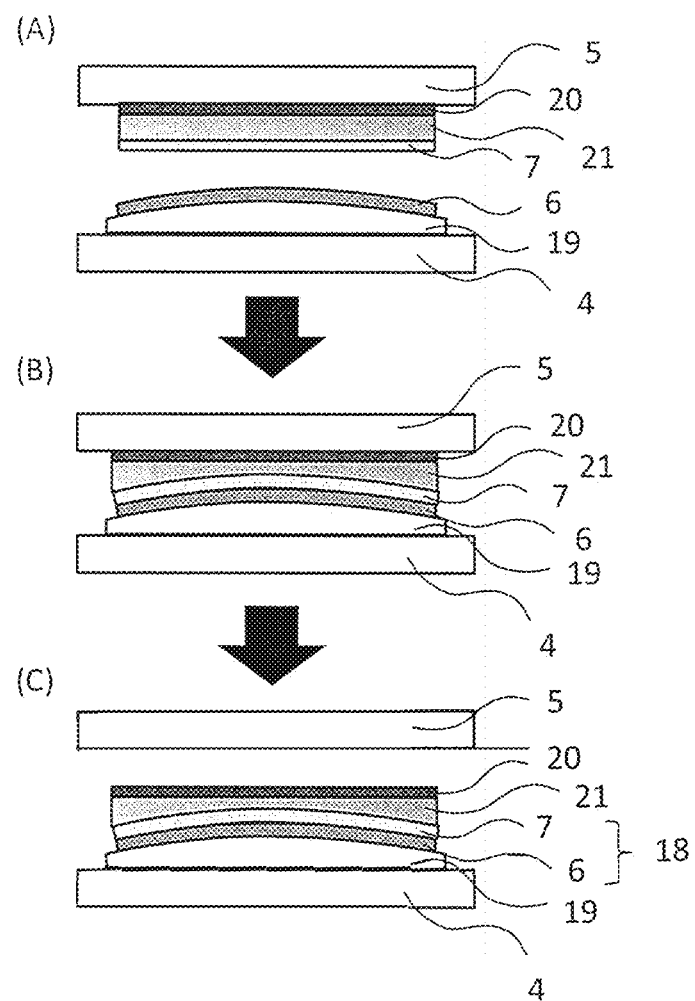
FIG. 14 is a view for illustrating a process in Step S210 to Step S214 of FIG. 13.

In Step S212, the lower substrate support base 4 and the upper substrate support base 5 are brought into close contact with each other, to thereby bring the diamond substrate 6 and the semiconductor substrate 7 into close contact with each other. FIG. 14 is a view for illustrating a process in Step S210 to Step S214 of FIG. 13. FIG. 14 corresponds to FIG. 6 in the first embodiment. In FIG. 14, the same members as those in the first embodiment are denoted by the same reference symbols as those therein. In addition, regarding the same members as those in the first embodiment, detailed description is omitted, and points different from those of the first embodiment are described.

In Step S212, as illustrated in (A), the diamond substrate 6 and the diamond substrate fixing jig 19 are fixed to the lower substrate support base 4, and the semiconductor substrate 7, the soft adhesive layer 21, and the support substrate 20 are fixed to the upper substrate support base 5. After that, as illustrated in (B), the lower substrate support base 4 and the upper substrate support base 5 are moved so as to move the diamond substrate 6 and the semiconductor substrate 7 in a direction of approaching each other. Thus, the diamond substrate 6 and the semiconductor substrate 7 are brought into close contact with and joined to each other under a pressure within a range of from 10 kPa to 100 MPa. In this case, the diamond substrate 6 is fixed to the diamond substrate fixing jig 19, and hence the deformation of the diamond substrate 6 can be suppressed to a minimum even when a large pressure is applied to the diamond substrate 6. As a result, the occurrence of damage to the diamond substrate 6 can be suppressed. In addition, a large pressure is applied to the soft adhesive layer 21, and hence the soft adhesive layer 21 is deformed. With this, the semiconductor substrate 7 is deformed into a shape that is substantially parallel to the shape of the diamond substrate 6. The semiconductor substrate 7 is joined to the diamond substrate 6 under a state of being deformed into the shape that is substantially parallel to the shape of the diamond substrate 6. After that, as illustrated in (C), the joint substrate 18 is taken out from the upper substrate support base 5. Step S212 includes a second substrate support base deforming step and a support base moving step.

As illustrated in FIG. 13, after Step S212, Step S213 to Step S217 are the same as Step S113 to Step S117 in the first embodiment.

As described above, in the semiconductor manufacturing device according to the second embodiment of the present invention, even when the semiconductor manufacturing device does not include the first mechanism or the second mechanism, a large pressure is applied to the diamond substrate 6 and the semiconductor substrate 7 without deforming the diamond substrate 6, and the diamond substrate 6 and the semiconductor substrate 7 are brought into close contact with each other, to thereby be able to obtain the satisfactory joint substrate 18.

As described above, in the semiconductor manufacturing method according to the second embodiment of the present invention, even when the semiconductor manufacturing device does not include the first mechanism or the second mechanism, a large pressure is applied to the diamond substrate 6 and the semiconductor substrate 7 without deforming the diamond substrate 6, and the diamond substrate 6 and the semiconductor substrate 7 are brought into close contact with each other, to thereby be able to obtain the satisfactory joint substrate 18.

In the second embodiment of the present invention, description is given of the configuration of the semiconductor manufacturing device including the diamond substrate fixing jig 19, the soft adhesive layer 21, and the support substrate 20. However, the present invention is not limited thereto. For example, the semiconductor manufacturing device may include the lower substrate support base 4 described in the first embodiment, and the soft adhesive layer 21 and the support substrate 20 described in the second embodiment, or the semiconductor manufacturing device may include the upper substrate support base 5 described in the first embodiment, and the diamond substrate fixing jig 19 described in the second embodiment.

Third Embodiment

Figure 15:
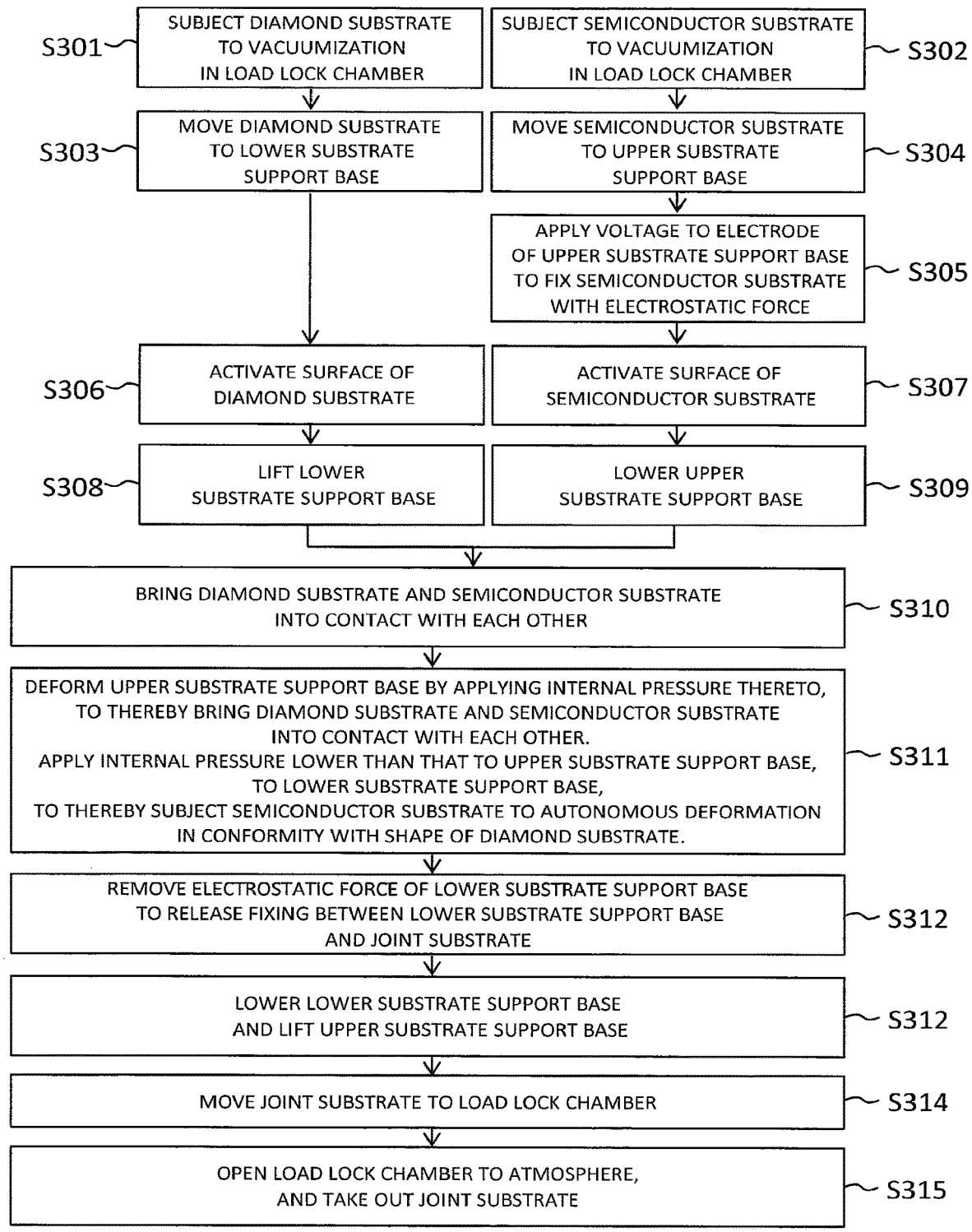
FIG. 15 is a flowchart for illustrating a semiconductor manufacturing method for chemically joining a diamond substrate and a semiconductor substrate to each other through use of a semiconductor manufacturing device according to a third embodiment of the present invention.

FIG. 15 is a flowchart for illustrating a semiconductor manufacturing method for chemically joining the diamond substrate 6 and the semiconductor substrate 7 to each other through use of a semiconductor manufacturing device according to a third embodiment of the present invention. The configuration of the lower substrate support base 4 in the semiconductor manufacturing device used in the third embodiment is the same as that illustrated in FIG. 2 in the first embodiment. Step S301 to Step S309 in the third embodiment are different from Step S101 to Step S111 in the first embodiment in the following points. Specifically, the third embodiment does not include Step S105 of deforming the surface 41 of the lower substrate support base 4 so that the surface 41 forms a parallel surface or a parallel plane with respect to the surface of the diamond substrate 6 opposed to the lower substrate support base 4. In addition, the third embodiment does not include Step S106 of fixing the diamond substrate 6 to the lower substrate support base 4 with an electrostatic force generated by the application of a voltage to the electrode contained in the lower substrate support base 4.

Figure 16:
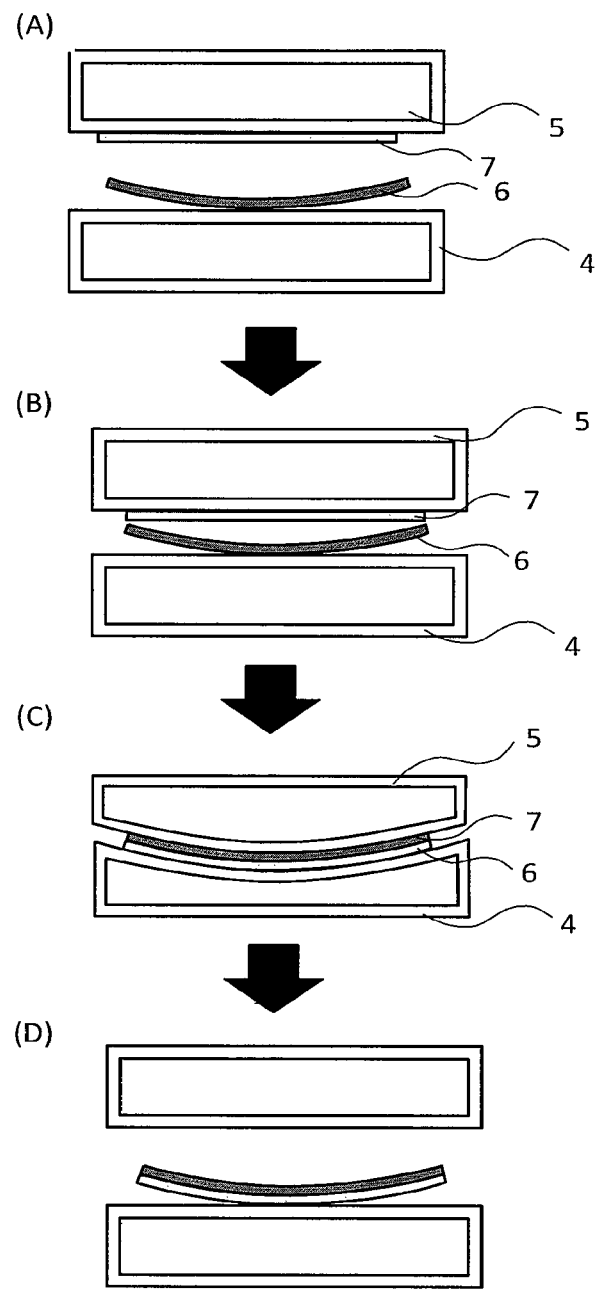
FIG. 16 is a view for illustrating a process in Step S308 to Step S313 of FIG. 15.

FIG. 16 is a view for illustrating a process in Step S308 to Step S313 of FIG. 15. FIG. 16 corresponds to FIG. 6 in the first embodiment. In FIG. 16, the same members as those in the first embodiment are denoted by the same reference symbols as those therein. In addition, regarding the same members as those in the first embodiment, detailed description is omitted, and points different from those of the first embodiment are described.

In Step S310, as illustrated in (B), at a time when or immediately before the diamond substrate 6 and the semiconductor substrate 7 are brought into contact with each other, lifting of the lower substrate support base 4 and lowering of the upper substrate support base 5 are temporarily stopped.

After that, in Step S311, each of the pressure of the cavity 42 of the lower substrate support base 4 and the pressure of the cavity of the upper substrate support base 5 is increased. In this case, each of the pressure of the cavity 42 of the lower substrate support base 4 and the pressure of the cavity of the upper substrate support base 5 is controlled so that the pressure of the cavity 42 of the lower substrate support base 4 is lower than that of the cavity of the upper substrate support base 5. In other words, each of the pressure of the cavity 42 of the lower substrate support base 4 and the pressure of the cavity of the upper substrate support base 5 is controlled so that the pressure with which the lower substrate support base 4 presses the diamond substrate 6 toward the semiconductor substrate 7 is smaller than the pressure with which the upper substrate support base 5 presses the semiconductor substrate 7 toward the diamond substrate 6.

In addition, in Step S311, the lower substrate support base 4 is lifted and the upper substrate support base 5 is lowered so that the surface of the diamond substrate 6 opposed to the semiconductor substrate 7 and the surface of the semiconductor substrate 7 opposed to the diamond substrate 6 are brought into close contact with each other under a pressure within a range of from 10 kPa to 100 MPa. The surface 41 of the lower substrate support base 4 is deformed in conformity with the shape of the surface of the diamond substrate 6 opposed to the lower substrate support base 4 through use of the pressure applied to the diamond substrate 6 and the semiconductor substrate 7 in the thickness direction. In addition, simultaneously, the surface 51 of the upper substrate support base 5 is deformed so that the surface of the semiconductor substrate 7 opposed to the diamond substrate 6 forms a parallel surface or a parallel plane with respect to the surface of the diamond substrate 6 opposed to the semiconductor substrate 7. With this, the surface of the semiconductor substrate 7 opposed to the diamond substrate 6 is deformed so as to form a parallel surface or a parallel plane with respect to the surface of the diamond substrate 6 opposed to the semiconductor substrate 7. The diamond substrate 6 and the semiconductor substrate 7 are brought into close contact with each other under the condition that the pressure with which the lower substrate support base 4 presses the diamond substrate 6 toward the semiconductor substrate 7 is set to be smaller than the pressure with which the upper substrate support base 5 presses the semiconductor substrate 7 toward the diamond substrate 6, and the surface of the semiconductor substrate 7 opposed to the diamond substrate 6 forms a parallel surface or a parallel plane with respect to the surface of the diamond substrate 6 opposed to the semiconductor substrate 7. Such deformation of the semiconductor substrate 7 is called "autonomous deformation".

When the surface of the semiconductor substrate 7 opposed to the diamond substrate 6 forms a parallel surface or a parallel plane with respect to the surface of the diamond substrate 6 opposed to the semiconductor substrate 7, the surface of the semiconductor substrate 7 opposed to the diamond substrate 6 is brought into close contact with the surface of the diamond substrate 6 opposed to the semiconductor substrate 7. As a result, the diamond substrate 6 and the semiconductor substrate 7 are joined to each other. Step S311 includes a support base moving step. The support base moving step includes a simultaneous deforming step. Step S312 to Step S315 are different from Step S113 to Step S117 in the first embodiment only in that Step S312 to Step S315 do not include Step S115 of removing an electrostatic force in the lower substrate support base 4 to release the fixing between the lower substrate support base 4 and the joint substrate 18.

As described above, in the semiconductor manufacturing method according to the third embodiment of the present invention, the pressure of the cavity 42 of the lower substrate support base 4 and the pressure of the cavity of the upper substrate support base 5 are controlled. With this, the surface of the semiconductor substrate 7 opposed to the diamond substrate 6 can be subjected to autonomous deformation so that the surface of the semiconductor substrate 7 opposed to the diamond substrate 6 forms a parallel surface or a parallel plane with respect to the surface of the diamond substrate 6 opposed to the semiconductor substrate 7. With this, it is not required to have a complicated structure in which the lower substrate support base 4 and the upper substrate support base 5 are deformed so that the surface of the semiconductor substrate 7 opposed to the diamond substrate 6 forms a parallel surface or a parallel plane with respect to the shape of the surface of the diamond substrate 6 opposed to the semiconductor substrate 7. As a result, the semiconductor manufacturing device can have a simple structure.

REFERENCE SIGNS LIST

1 container, 2 gate valve, 3 load lock chamber, 4 lower substrate support base, 5 upper substrate support base, 6 diamond substrate, 7 semiconductor substrate, 8 lower substrate support base drive unit, 9 lower substrate support base drive control unit, 10 upper substrate support base drive unit, 11 upper substrate support base drive control unit, 12 beam source, 13 vacuum pump, 14 vacuum pump, 15 lower actuator, 16 lower substrate support base surface shape control unit, 17 upper substrate support base surface shape control unit, 18 joint substrate, 19 diamond substrate fixing jig, 20 support substrate, 21 soft adhesive layer, 41 surface, 42 cavity, 51 surface, 52 soft layer, 53 hollow portion, 71 outer edge, 72 soft layer

The invention claimed is:

1. A semiconductor manufacturing method, comprising:
a first substrate arranging step of arranging a diamond substrate on a first substrate support base;
a second substrate arranging step of arranging a semiconductor substrate on a second substrate support base provided so as to be opposed to the first substrate support base;
a support base moving step of, after the first substrate arranging step and the second substrate arranging step, moving one or both of the first substrate support base and the second substrate support base to bring the diamond substrate and the semiconductor substrate into close contact with each other under a state in which a pressure is applied to the diamond substrate and the semiconductor substrate in a thickness direction of the semiconductor substrate;
a first substrate support base deforming step of deforming a surface of the first substrate support base opposed to the second substrate support base in conformity with a shape of a surface of the diamond substrate opposed to the first substrate support base; and a second substrate support base deforming step of, after the first substrate support base deforming step, deforming a surface of the second substrate support base opposed to the first substrate support base so that a surface of the semiconductor substrate opposed to the diamond substrate forms a parallel surface or a parallel plane with respect to a surface of the diamond substrate opposed to the semiconductor substrate,
wherein structures of the first substrate support base and the second substrate support base are configured so that the shape of the surface of the first substrate support base opposed to the second substrate support base and the shape of the surface of the second substrate support base opposed to the first substrate support base can be deformed,
wherein by deforming the structures, the surface of the first substrate support base opposed to the second substrate support base is deformed from a first state of the first substrate support base having a first amount of curvature to a second state of the first substrate support base having an increased amount of curvature, and the surface of the second substrate support base opposed to the first substrate support base is deformed from a first state of the second substrate support base having a second amount of curvature to a second state of the second substrate support base having an increased amount of curvature.

2. The semiconductor manufacturing method according to claim 1, wherein the first substrate support base deforming step includes, before the first substrate arranging step, deforming the surface of the first substrate support base opposed to the second substrate support base so that the surface of the first substrate support base opposed to the second substrate support base forms a parallel surface or a parallel plane with respect to the surface of the diamond substrate opposed to the first substrate support base.

3. The semiconductor manufacturing method according to claim 1, wherein the semiconductor substrate has a dimension in the thickness direction of 20 μm or less.

4. The semiconductor manufacturing method according to claim 1, further comprising a first substrate surface activating step of activating the surface of the diamond substrate.

5. The semiconductor manufacturing method according to claim 1, wherein the second substrate support base deforming step includes deforming the surface of the second substrate support base opposed to the first substrate support base in conformity with a shape of a surface of the diamond substrate opposed to the second substrate support base.

6. The semiconductor manufacturing method according to claim 5,
wherein the first substrate support base deforming step includes deforming the surface of the first substrate support base opposed to the second substrate support base in conformity with a warped shape of a surface of the diamond substrate opposed to the first substrate support base, and
wherein the second substrate support base deforming step includes deforming the surface of the second substrate support base opposed to the first substrate support base in conformity with a warped shape of the surface of the diamond substrate opposed to the second substrate support base.

7. A semiconductor manufacturing device, comprising:
a first substrate support base configured to support a diamond substrate;
a second substrate support base, which is provided so as to be opposed to the first substrate support base, and which is configured to support a semiconductor substrate;
a support base driver configured to move one or both of the first substrate support base and the second substrate support base to bring the diamond substrate and the semiconductor substrate into close contact with each other under a state in which a pressure is applied to the diamond substrate and the semiconductor substrate in a thickness direction of the semiconductor substrate;
a second mechanism configured to deform a surface of the second substrate support base opposed to the first substrate support base so that a surface of the semiconductor substrate opposed to the diamond substrate forms a parallel surface or a parallel plane with respect to a surface of the diamond substrate opposed to the semiconductor substrate; and
the semiconductor manufacturing device comprising a first mechanism configured to deform to a non-planar shape the surface of the first substrate support base facing towards the second substrate support base in conformity with a surface of the diamond substrate facing towards the first substrate support base,
wherein the first mechanism is configured to deform to the non-planar shape the surface of the first substrate support base facing towards the second substrate support base in conformity with the surface of the diamond substrate facing forwards the first substrate support base without deforming the diamond substrate,
wherein the support base driver is configured to bring the diamond substrate and the semiconductor substrate into close contact with each other under the state in which the pressure is applied to the diamond substrate and the semiconductor substrate in the thickness direction of the semiconductor substrate without deforming the diamond substrate.

8. The semiconductor manufacturing device according to claim 7,
wherein the second substrate support base is configured to support the semiconductor substrate so that the surface of the semiconductor substrate opposed to the diamond substrate is deformable, and
wherein, when the pressure is applied to the diamond substrate and the semiconductor substrate in the thickness direction, the surface of the semiconductor substrate opposed to the diamond substrate is formed into a parallel surface or a parallel plane with respect to a surface of the diamond substrate opposed to the semiconductor substrate through use of the pressure.

9. A semiconductor manufacturing device, comprising:
a first substrate support base configured to support a diamond substrate;
a second substrate support base, which is provided so as to be opposed to the first substrate support base, and which is configured to support a semiconductor substrate;
a support base driver configured to move one or both of the first substrate support base and the second substrate support base to bring the diamond substrate and the semiconductor substrate into close contact with each other under a state in which a pressure is applied to the diamond substrate and the semiconductor substrate in a thickness direction of the semiconductor substrate; and
a first substrate fixing jig, which is provided between the diamond substrate and the first substrate support base, and has a surface opposed to the diamond substrate being a parallel surface or a parallel plane with respect to a surface of the diamond substrate opposed to the first substrate support base,
wherein the second substrate support base is configured to support the semiconductor substrate so that a surface of the semiconductor substrate opposed to the diamond substrate is deformable, and
wherein, when the pressure is applied to the diamond substrate and the semiconductor substrate in the thickness direction, the surface of the semiconductor substrate opposed to the diamond substrate is formed into a parallel surface or a parallel plane with respect to a surface of the diamond substrate opposed to the semiconductor substrate through use of the pressure,
wherein the support base driver is configured to bring the diamond substrate and the semiconductor substrate into close contact with each other under the state in which the pressure is applied to the diamond substrate and the semiconductor substrate in the thickness direction of the semiconductor substrate without deforming the diamond substrate.

* * * * *